(12) United States Patent
Martinez et al.

(10) Patent No.: US 8,902,600 B2
(45) Date of Patent: Dec. 2, 2014

(54) ELECTRICALLY ACTIVATABLE INTEGRATED MECHANICAL ANTI-ROLLBACK DEVICE WITH ONE OR MORE POSITIONS

(71) Applicant: STMicroelectronics (Rousset) SAS, Rousset (FR)

(72) Inventors: Albert Martinez, Bouc Bel Air (FR); Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 129 days.

(21) Appl. No.: 13/765,064

(22) Filed: Feb. 12, 2013

(65) Prior Publication Data

US 2013/0250531 A1  Sep. 26, 2013

(30) Foreign Application Priority Data

Feb. 22, 2012  (FR) ...................... 12 51597

(51) Int. Cl.
*H05K 5/00* (2006.01)
*H05K 1/02* (2006.01)
*H01G 5/16* (2006.01)
*H01H 1/00* (2006.01)
*H01H 59/00* (2006.01)
*H05K 3/30* (2006.01)
*H01G 5/04* (2006.01)

(52) U.S. Cl.
CPC .. *H05K 1/02* (2013.01); *H01G 5/16* (2013.01); *H01H 1/0036* (2013.01); *H01H 59/0009* (2013.01); *H05K 3/30* (2013.01); *H01G 5/04* (2013.01)
USPC ........... 361/752; 361/748; 361/736; 361/753; 361/679.01

(58) Field of Classification Search
USPC .............................. 361/752, 748, 736, 679.01
See application file for complete search history.

(56) References Cited

U.S. PATENT DOCUMENTS

2007/0018761 A1  1/2007  Yamanaka et al.
2009/0219128 A1  9/2009  Elliott et al.
2009/0296307 A1  12/2009  Siamak et al.

FOREIGN PATENT DOCUMENTS

| DE | 10 2009 047 599 | 6/2011 |
| EP | 1 143 467 | 10/2001 |
| EP | 1 637 831 | 3/2006 |
| GB | 2 410 371 | 7/2005 |

*Primary Examiner* — Andargie M Aychillhum
(74) *Attorney, Agent, or Firm* — Allen, Dyer, Doppelt, Milbrath & Gilchrist, P.A.

(57) ABSTRACT

A thermally deformable assembly is formed in an integrated-circuit metallization level. The physical behavior of the metal forming the assembly brings the assembly into contact with a stop-forming body when subjected to a temperature change caused by a current flow. A natural rollback to the initial configuration in which the assembly is a certain distance away from the body is prevented. The state or configuration of the assembly is determined by a capacitive reader.

31 Claims, 10 Drawing Sheets

Initial configuration

FIG.2
Additional configuration

FIG.1
Initial configuration

ELECTRICALLY ACTIVATABLE INTEGRATED MECHANICAL ANTI-ROLLBACK DEVICE WITH ONE OR MORE POSITIONS

FIELD OF THE INVENTION

The invention relates to integrated circuits, and more particularly, to integrated mechanical anti-rollback devices with several electrically activatable positions.

BACKGROUND OF THE INVENTION

An anti-rollback device makes it possible, for example, to ensure that the change in the state of a component of a system is strictly one-way. Thus for example, if the system employs a software component of version V1 containing security vulnerabilities, the owner of the system may manually update the software to an updated version V2 while making sure that the software cannot revert back to version V1.

Another example is a system allowing an application to be used N times. Each time the application is executed, an internal count-up (or count-down) counter is incremented (or decremented) to N (or to 0). Furthermore, this counter cannot reverse direction. Generally, an anti-rollback device uses a technology that either allows a physical quantity to be irreversibly modified, or allows the new value to be recorded in a non-volatile memory device updated by a trusted entity.

In systems on chips (SOCs), in the first case fuses are generally used and in the second case a non-volatile memory (EEPROM, etc.) is generally used. However, although fuses can be produced in purely digital technology, they are costly in terms of their footprint and are not flexible because a high-voltage source needs to be provided, either on the chip or off the chip, in order to "blow" them. As for non-volatile memories, they are also costly both in technological terms and in terms of their footprint.

SUMMARY OF THE INVENTION

An essentially mechanical, electrically activatable, anti-rollback device is provided that can be integrated into CMOS technology processes by adding a few additional operations (addition of a mask level, for example) and without using conventional MEMS technology.

A thermally deformable assembly may be produced in an integrated-circuit metallization level, and with the physical behavior of the metal forming this thermally deformable assembly, it is possible to determine the state or the configuration of the assembly by reading a capacitance. When the metal is subjected to a temperature change caused by a current flow, this brings the assembly into contact with a stop-forming body. This prevents a natural rollback to the initial configuration (in which the assembly is a certain distance away from the body).

An integrated circuit may comprise a substrate, and a part comprising several metallization levels separated by an insulating region on the substrate. Those skilled in the art commonly refer to such a part using the acronym BEOL (back end of lines).

The integrated circuit may further comprise, in the part, an electrically activatable, single- or multi-position mechanical anti-rollback device. The device may comprise, in a housing, a first body and an assembly securely fastened to at least one wall of the housing. The assembly may be located in a first metallization level and has an initial configuration. It may be thermally deformable so as to adopt at least one additional configuration. Each configuration may correspond to a position of the anti-rollback device. The first body and the assembly may be mutually arranged so that the assembly is a certain distance away from the first body in the initial configuration, and has a part making contact with the first body in the additional configuration. A natural rollback to the initial configuration may thus be prevented.

The integrated circuit may also comprise activation means or activation circuitry to make an electrical current flow through at least one part of the assembly so as to increase its temperature and make it pass from its initial configuration to the additional configuration. The integrated circuit may also comprise detection means or a detector to detect the position of the anti-rollback device. The detector may comprise a variable capacitance device having a first electrode securely fastened to the assembly and at least one second electrode placed in the housing.

Such a mechanical anti-rollback device may thus be produced in what is called the BEOL part of the integrated circuit. This may be in the same metallization level or in several different metallization levels. It therefore has an essentially metal structure that is either two-dimensional or three-dimensional. It is easily integrated into a CMOS technology process because it is largely produced in steps conventionally used to produce the BEOL part of the integrated circuit.

Moreover, the capacitive device makes it very easy to determine the configuration of the assembly because the various configurations respectively correspond to various distances separating the two electrodes.

Moreover, when the assembly makes contact with the first body, a natural rollback to the initial configuration is prevented, and an anti-rollback device with a naturally irreversible blocked state may be obtained. This is so the assembly cannot revert by itself to a prior state when the temperature drops back to below the temperature that allowed it to move into its blocked state, unless specific action acts on the assembly to unblock it, for example.

Various embodiments of the assembly, the first body and the capacitive device are possible. Thus, the thermally deformable assembly may comprise a beam held in at least two different locations by at least two arms that are securely fastened to edges of the housing. The beam and the arms may be located in the same first metallization level. The beam may comprise the part making contact with the first body. The arms may be identical or different, especially in terms of their geometry.

As for the first body, it may comprise at least one body arm securely fastened to one edge of the housing, and may comprise a first part located in a second metallization level different from the first metallization level. A second part may be joined to the first part and extends between the two metallization levels. The beam may be a certain distance away from the second part of the body arm in the initial configuration, and may be hooked by and makes contact with the second part of the body arm in the additional configuration.

The body arm may comprise a metal cantilever beam forming the first part and extends substantially perpendicular to the beam of the assembly. An electrically conductive appendage may be located in the vicinity of the free end of the cantilever beam and forms the second part. The end part of the appendage may extend through the first metallization level flaring in the direction of the cantilever beam.

The assembly may comprise the beam and two arms securely fastened to the beam on two opposite sides of the beam. The two points may be where the two arms are fastened to the beam and are spaced apart in the longitudinal direction of the beam. The portion of the beam hooked in the additional configuration may be located between a free end of the beam and one of the fastening points.

In one variation, the assembly may comprise a part forming a hook and the first body may comprise a part forming a hook. The latter may be located in the first metallization level. The two parts may form hooks mutually separated by a certain distance in the initial configuration, and may be mutually interlocked in the additional configuration.

The assembly may comprise a first pair of first arms respectively fixed to a first side of a beam in the vicinity of the two ends of the beam. A second pair of second arms may be respectively fixed to a second side of the beam opposite the first side. This is in the vicinity of the two ends of the part located between the arms of the first pair, the two points where a first arm and a second neighboring arm are respectively fastened to the beam being spaced apart in the longitudinal direction of the beam, and the part of the assembly forming a hook extending from the central part of the beam. Each first arm may comprise several branches joined to an end part securely fastened to the beam. It is of course possible for the anti-rollback device to be able to occupy more than two positions.

Thus, the assembly steps through a sequence of several additional configurations respectively corresponding to a sequence of several increasing temperatures. The first body and the assembly may be mutually arranged so that, in the additional configurations, the assembly respectively makes contact with different parts of the first body. This prevents a natural rollback from an actual additional configuration to a prior additional configuration when the temperature drops back to below the temperature associated with that of the actual additional configuration. The assembly may be electrically activatable so as to pass from an actual additional configuration to the following additional configuration. The activation means or circuitry may be able to make an electrical current flow through at least one part of the assembly to increase its temperature and make it pass from an actual additional configuration to the additional configuration.

As for the capacitive device, it may, according to one embodiment, comprise, in the housing, a second fixed electrically conductive body at least one part of which forms the second electrode. One part of the thermally deformable assembly may form the first electrode. The various configurations respectively correspond to various distances separating the two electrodes, and the detection means or detector may furthermore comprise means or circuitry for reading the capacitance of the capacitive device. The second electrode may be located in a metallization level other than the first metallization level in which the assembly is located, or in the same metallization level.

To make the anti-rollback device even more secure, the integrated circuit may further comprise coded control means or a controller to control the activation circuitry.

Moreover, the anti-rollback device may be resettable. In this respect, circuitry may be advantageously provided to release the part of the assembly making contact with the first body to allow it to return to its initial configuration.

BRIEF DESCRIPTION OF THE DRAWINGS

Other advantages and features of the invention will become clear on examining the detailed description of non-limiting embodiments and the appended drawings in which.

DETAILED DESCRIPTION OF THE PREFERRED EMBODIMENTS

Figure 1:
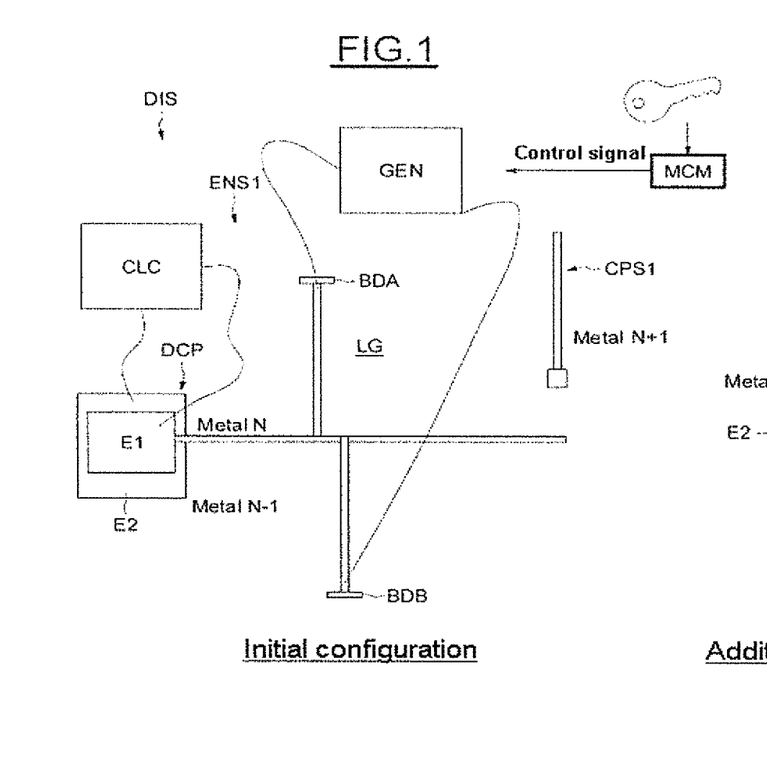
FIG. 1 is a block diagram of a mechanical anti-rollback device in accordance with the present invention.

In reference to FIG. 1, the mechanical anti-rollback device DIS according to this embodiment comprises a housing LG, an assembly ENS1 securely fastened to at least one wall BDA, BOB of the housing, and a first body CPS1. The assembly ENS1 is located in a first metallization level of the integrated circuit, for example, metallization level N. In this embodiment, the first body CPS1 essentially lies in the immediately higher metallization level N+1.

Part of the assembly ENS1 forms a first electrode E1 of a capacitive device DCP. The capacitive device DCP comprises a second electrode E2 placed in the metallization level N−1. The two electrodes E1 and E2, separated by air, form a capacitor. The capacitance of which may vary since, as will be seen in more detail below, since the electrode E1 may move relative to the electrode E2.

To measure the capacitance of the capacitive device DCP, an electrical circuit CLC is connected to the terminals of the two electrodes E1 and E2. In FIG. 1, the assembly ENS1 has an initial configuration in which it is a certain distance away from the first body CPS1.

Activation means or circuitry GEN connected to two different locations on the assembly ENS1 are able to make an electrical current flow through at least one part of the assembly to increase its temperature.

Figure 2:
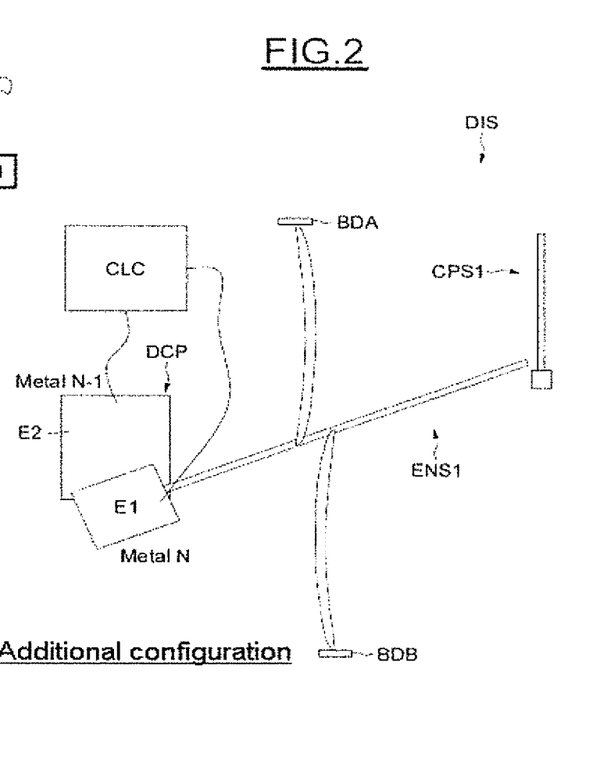
FIG. 2 is a block diagram of the mechanical anti-rollback device illustrated in FIG. 1 after being thermally deformed.

Since the assembly ENS1 is thermally deformable, the temperature increase induced by the current via Joule heating will cause it to deform, as illustrated in FIG. 2. This causes the assembly ENS1 to adopt an additional configuration in which it makes contact with a part of the first body CPS1. A natural rollback to the initial configuration when the temperature drops back below the temperature that allowed it to move into its additional configuration is thus prevented.

It may be seen then that in this additional configuration, the electrode E1 moves relative to the electrode E2. Therefore, the area of overlap between these two electrodes changes relative to that of the initial configuration. This means that the capacitance of the capacitive device DCP changes. This capacitance, read by the circuit CLC, therefore makes it possible to easily determine whether the device DIS is in a second position corresponding to the additional configuration of the assembly ENS1.

The activation means GEN makes an electrical current flow through at least one part of the assembly ENS1. In this instance, the current flows through the two arms joined to the edges BOA and BOB of the housing. The activation means GEN may have a conventional structure known by those skilled in the art. For example, a voltage Vdd may be applied to the edge BOA of the housing and the edge BOB may be grounded for a sufficient time to allow the assembly ENS1 to pass into the additional configuration and to be hooked by the body CPS1.

To increase the secure nature of the anti-rollback device, it may be envisaged to control the activation means GEN using control means or controller MCM employing a cryptographic algorithm with a secret key, for example. Thus, an encrypted control signal, delivered as input to the controller MCM, will be decrypted by the controller MCM to activate the activation circuitry GEN. It should be noted that this algorithm may be a symmetric or an asymmetric private-key algorithm.

The electric circuit CLC allowing the capacitance of the capacitive device to be determined is also a conventional circuit as readily understood by those skilled in the art.

Digital means or circuitry may measure the period of oscillation of a circuit containing the capacitor, wherein the capacitance thereof is to be measured. The time it takes to charge the capacitor to a certain value based on a constant current flowing into this capacitor may also be measured. An AC current source may be placed across the terminals of a Wheatstone bridge, one branch contains the capacitor that is to be measured, and other branch contains a reference capacitor having variable and known reference capacitances.

Preferably, the capacitance of the capacitive device is read by the circuit CLC when current is not being made to flow through the assembly ENS1 by the activation means GEN. Thus, the capacitance of the capacitive device will preferably be measured in the absence of current flowing through the assembly ENS1 or in the absence of a voltage across its terminals.

Although the electrode E2 has been shown in FIGS. 1 and 2 in the metallization level N−1, it can more generally be located in a different metallization level, for example, the level N−2. As a variation, the capacitive device could comprise a third electrode placed, for example, in the metallization level N+1. The electrode E1 then moves between the second and third electrodes, which remain stationary.

Figure 3:
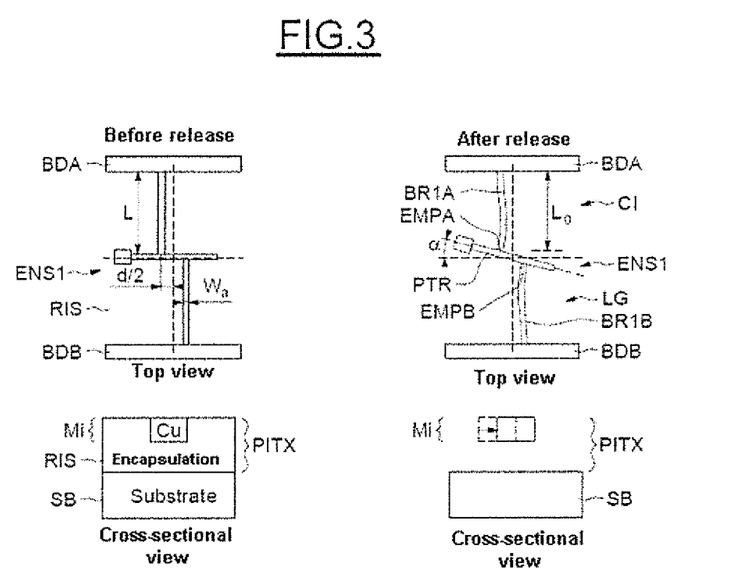
FIG. 3 is a more detailed block diagram of the assembly ENS1 illustrated in FIG. 1.

Various embodiments of the device DIS, and more particularly the assembly ENS1, will now be described in greater detail. Referring now to FIG. 3, the assembly ENS1 is produced in the same metallization level Mi of the interconnect part PITX of the integrated circuit CI. This interconnect part likewise is widely referred to by those skilled in the art as the BEOL part. The interconnect part PITX is located on the substrate SB.

In the described examples, the assembly ENS1 is made of metal, and more particularly, of copper. The metal could also be aluminium or tungsten.

The assembly ENS1 takes the form of an asymmetric cross. This assembly ENS1 comprises a first arm BR1A and a second arm BR1B securely fastened to a beam PTR, also called the central pointer. It is fastened in two locations EMPA and EMPA respectively located on two opposite sides of the beam PTR. These two locations EMPA and EMPA are spaced apart by a distance d.

As will be seen in greater detail below, the assembly ENS1 is produced using conventional techniques for producing metal tracks in the interconnect part PITX, especially techniques used in CMOS technology. The left-hand part of FIG. 3 shows the assembly ENS1 encapsulated in an insulating region RIS, whereas the right-hand part of FIG. 3 shows the same assembly after the insulating region has been etched so as to release the arms BR1A and BR1B and the beam PTR.

The assembly ENS1 thus released lies inside the housing LG resulting from the removal of the insulating region RIS. The two arms BR1A and BR1E are securely fastened to the edges BDA and BBB of the housing.

It has been shown in the article by R. Vayrette et al. entitled: "Residual stress estimation in damascene copper interconnects using embedded sensors", Microelectronics Engineering 87 (2010) 412-415, that after de-encapsulation of an assembly of this type, relaxation of stresses occurs. This causes a longitudinal residual deformation of the arms which deviates the pointer, such as in a clockwise direction.

More precisely, for an arm of constant width $W_a$, the deviation a is given by the following formula:

$$a = \frac{d \cdot L \cdot L_0 (L - L_0)}{d^2(2L - L_0) + \frac{4}{3} \cdot W_a^2 \cdot L_0}$$

where $L_0$ is the length of the arm after relaxation.

$$L_0 \text{ equals } 1 + \frac{\frac{L}{\sigma}}{E}$$

where σ is the average longitudinal residual stress, and E is the Young's modulus of the material (approximately equal to 130 GPa for isotropic copper).

σ is determined experimentally from measurements taken on test structures having various values of d and various values of $W_a$. Therefore, if 1/d equals 2 λm$^{-1}$ and $W_a$ equals 0.5 μm, σ is approximately 800 MPa.

As an indication, for arms with a length of 10 microns and a width of 0.2 microns, this gives a deviation of the pointer on the order of 0.2 microns for a spacing d of 2 microns. For a spacing of 1 micron, this gives a deviation a on the order of 0.3 microns. This corresponds to assemblies annealed at 400° with an insulating region RIS of 0.56 microns.

For a line width (arm width) on the order of 0.2 microns, this gives a mean residual longitudinal deformation of between 0.25% and 0.30% for a line width (arm width) of 0.5 microns, 0.20% for a line width of 1 micron, and slightly less than 0.20% for a line width of 2 microns.

Depending on the applications that are to be envisaged, and notably depending on the desired accuracy, the residual deviation a of the pointer PTR may be taken into account.

When the activation means GEN makes an electrical current flow through at least one of the arms of the assembly ENS1, in this instance through both arms ENS1, between the two edges BDA and BDB of the housing, Joule heating causes the temperature of the two arms to increase. This makes the beam PTR turn counter-clockwise.

Since the thermal expansion coefficient of the material forming the expandable arms, and the value of the current, and therefore the temperature increase resulting from Joule heating are known, the deviation of the pointer PTR may be easily simulated. The geometry of the arms includes their length, width and thickness. The distance d separates the two fastening points. By calculating torques, the first body CPS1 may be positioned in the housing in such a way that, above a certain temperature corresponding to a first current value, the beam PTR makes contact with the body CPS1 as illustrated in FIG. 2.

Figure 4:
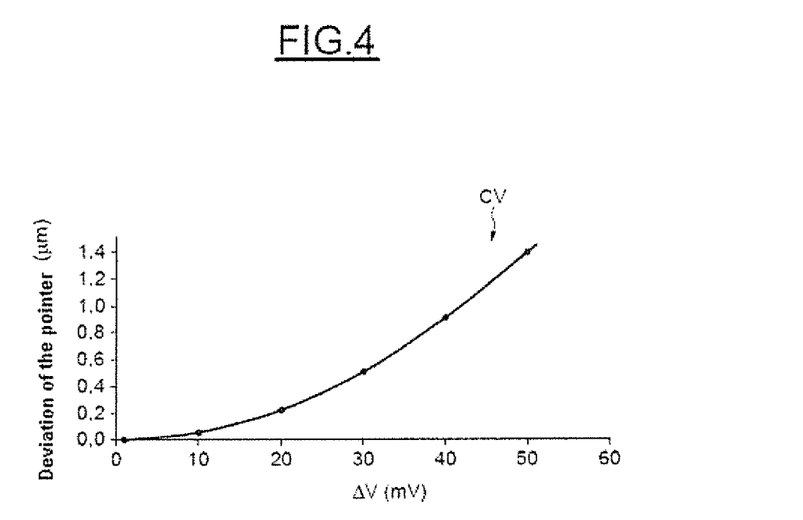
FIG. 4 is a plot on deviation of the pointer PTR as a function of the potential difference applied between the edges BDA and BDB of the housing illustrated in FIG. 1.

FIG. 4 illustrates, by way of example, a curve CV showing the deviation of the pointer PTR as a function of the potential difference applied between the edges BDA and BDB of the housing, for a line width of 0.2 microns.

Figure 5:
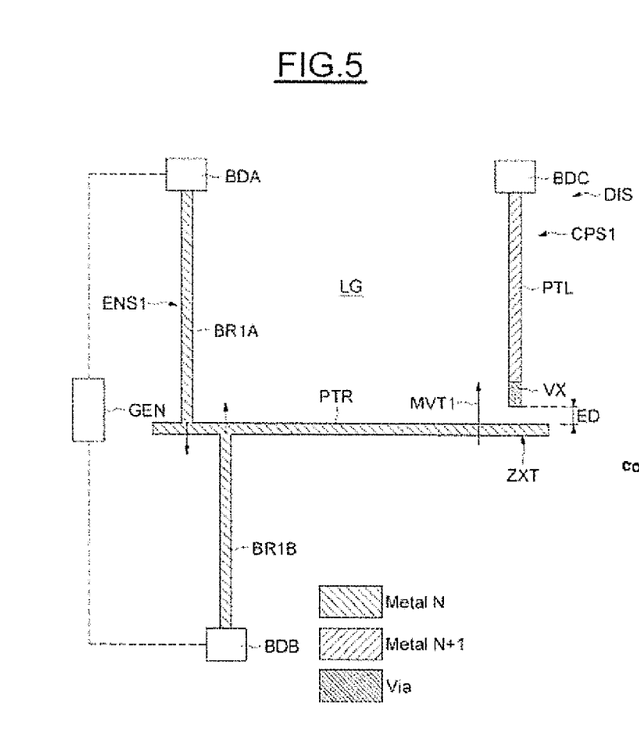
FIG. 5 is a block diagram of another embodiment of the mechanical anti-rollback device in accordance with the present invention.
Figure 6:
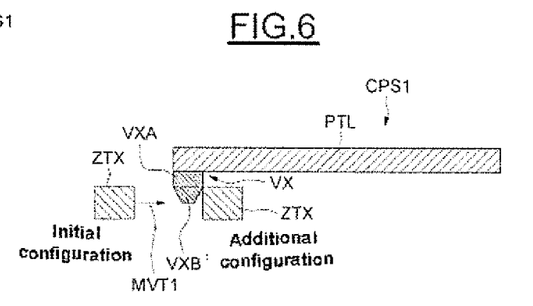
FIG. 6 is a cross-sectional view of the cantilever beam PTL of the body CPS1 illustrated in FIG. 5.

In the embodiment illustrated in FIGS. 5 and 6, the arms BR1A and BR1B of the assembly ENS1 are fixed in the vicinity of a first end zone of the beam PTR, with the other end zone ZXT of this beam PTR being free. The body CPS1 comprises a cantilever beam PTL securely fastened to a part BDC of an edge of the housing LG, and a metal appendage VX located at the free end of the beam PTL.

As can be seen more particularly in FIG. 6, the beam PTR (and the arms BR1A and BR1E of the assembly ENS1) is produced in a first metallization level, namely the metallization level N. The cantilever beam PTL of the body CPS1 is produced in another metallization level different from the first metallization level, in this instance the metallization level N+1.

Moreover, the appendage VX of the body CPS1 is produced in the via level located between the metallization levels N and N+1. As will be seen in greater detail below, the appendage VX is produced in a similar way to that used to produce the vias in the BEOL part of the integrated circuit. The appendage VX comprises a part VXA extruded between the two metallization levels N and N+1, and extended by an end part VXB extending into the first metallization level N. This end part VXB flares in the direction of the cantilever beam PTL.

In FIG. 5, the assembly ENS1 is in an initial configuration, for example, at room temperature with no current flowing through it. When the temperature of the assembly ENS1 rises, the arms BR1A and BR1B of the assembly expand and the end ZXT of the beam PTR is consequently subjected to a movement MVT1. In the illustrated embodiment it is bent.

Thus, and because the amplitude of this movement can be easily calculated, especially as indicated above as a function of the geometry of the arms and the expansion coefficient of the material, the distance ED between the end ZXT of the beam PTR and the via VX in the initial configuration is determined so that, above a certain temperature, the assembly ENS1 adopts an additional configuration. As illustrated in FIG. 6, the end zone ZXT of the beam PTR moves to the other side of the via VX and is thus immobilized and hooked by the via VX of the body CPS1.

The movement of the end zone ZTX of the beam PTR from one side of the via VX to the other is especially made possible by the bevelled shape of the end part VXB of the via VX and also by the fact that the cantilever beam PTL bends when the end zone ZTX makes contact with the bevelled part VXB of the via VX. This upward motion makes it possible for the zone ZTX to pass to the other side of the via. Once the zone ZTX has passed to the other side of the via (additional configuration), the via VX can re-descend and hook the zone ZTX by making contact with it.

Furthermore, in this additional configuration, the beam PTR of the assembly ENS1 cannot naturally return to its initial configuration even if the temperature returns to the initial temperature (after the current is made to stop flowing) since the beam PTR is blocked by the via VX.

In the embodiment illustrated in FIGS. 5 and 6 the anti-rollback device had a naturally irreversible state, as explained above. It is possible, as illustrated in FIGS. 7, 8 and 9, to also provide releasing means or circuitry MLB configured to release a beam immobilized by the body CPS1.

Figure 7:
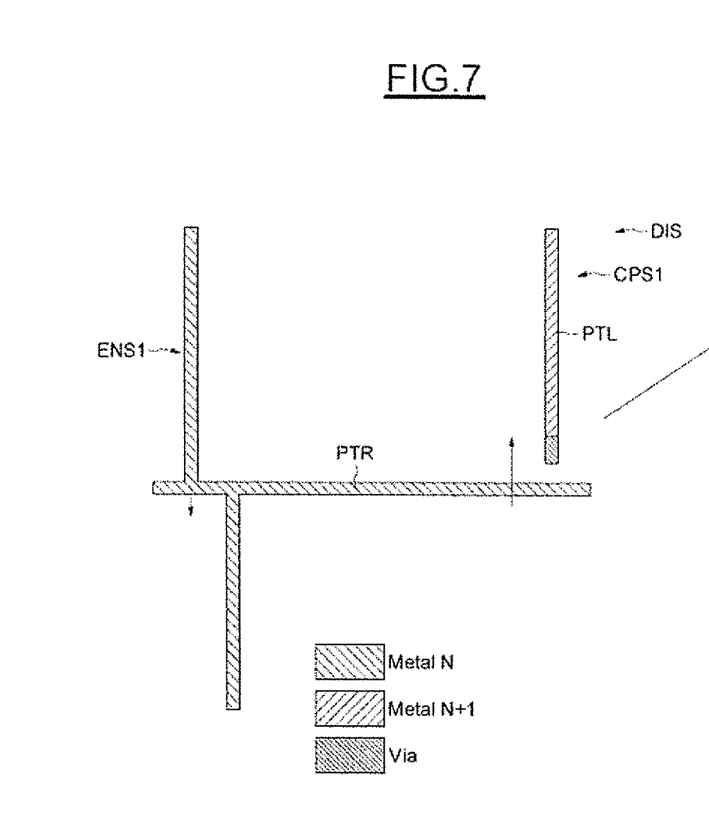
FIG. 7 is a cross-sectional view of the different metal layers for the mechanical anti-rollback device illustrated in FIG. 5.
Figure 8:
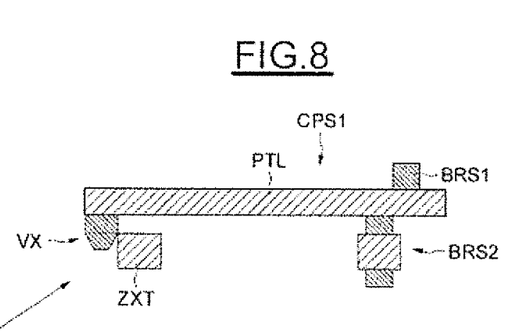
FIG. 8 is a cross-sectional diagram of the releasing circuitry for the mechanical anti-rollback device illustrated in FIG. 5.
Figure 9:
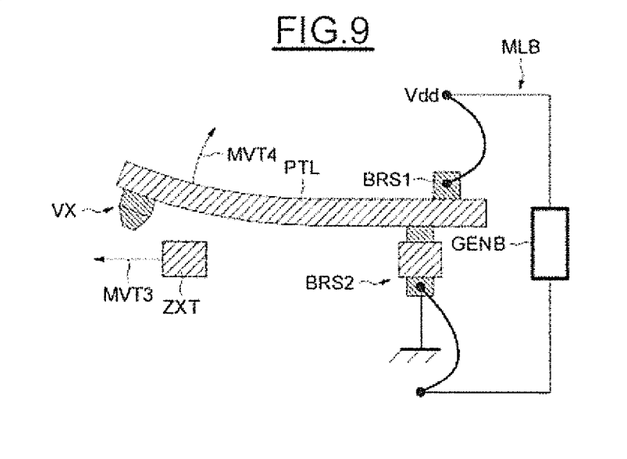
FIG. 9 is a cross-sectional diagram of the releasing circuitry for the mechanical anti-rollback device illustrated in FIG. 5 after activation by an activator GENB.

In the example illustrated in FIGS. 7 to 9, the releasing means or circuitry MLB comprises, as illustrated in FIG. 8, a first arm BRS1 formed by a via, and a second arm BRS2 formed by a metal portion located in the metallization level N and by two vias placed on either side of this metal portion.

The arms BRS1 and BRS2 are securely fastened to the beam PTL near the end opposite the end to which the appendage VX is connected. They are spaced out relative to one another to form a thermally deformable assembly with the beam PTL.

In addition to these arms BRS1 and BRS2, the releasing means or circuitry MLB also comprise, as illustrated in FIG. 9, activation means or circuitry GENB, for example, having a structure similar to the activation means GEN in FIG. 5 for generating a potential difference between the two arms BRS1 and BRS2 to deform the beam PTL by Joule heating. This deformation movement MVT4 causes the beam PTL to bend upwards.

Thus, FIG. 7 illustrates the assembly ENS1 in its initial configuration in which the beam PTR is a certain distance away from the body CPS1. FIG. 8 illustrates the assembly ENS1 in its additional configuration in which the end ZXT of the beam PTR is hooked and immobilized by the appendage VX of the body CPS1.

Furthermore, FIG. 9 illustrates the release of the beam PTR by the bending of the beam PTL caused by the movement MVT4. Thus, the beam PTR, released from being immobilized by the appendage VX, returns to its initial configuration (movement MVT3). The anti-rollback device is then reset and may be reused.

In the embodiments illustrated in the preceding figures, the assembly ENS1 and the body CPS1 were produced in different metallization levels. In the embodiment illustrated in FIGS. 10 and 11, they are produced in the same metallization level, such as the metallization level N, for example.

Figure 10:
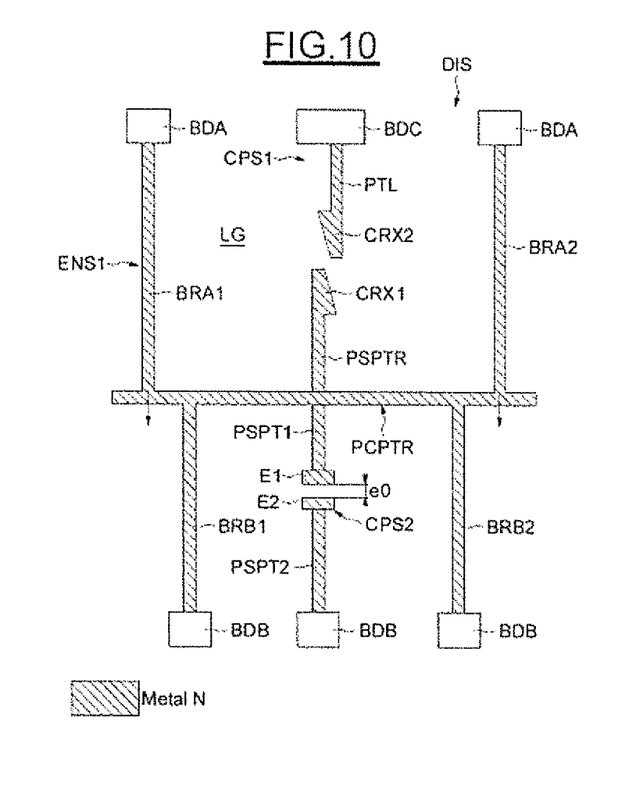
FIG. 10 is a block diagram of another embodiment of the mechanical anti-rollback device in accordance with the present invention.
Figure 11:
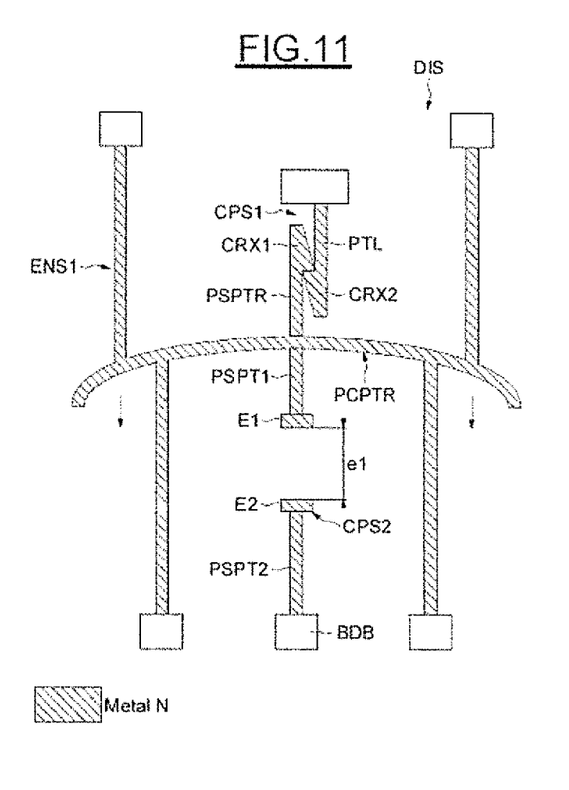
FIG. 11 is a block diagram of the mechanical anti-rollback device illustrated in FIG. 10 after being thermally deformed.

More precisely, in such an embodiment in the same metallization level, the first assembly comprises a part forming a hook and the body CPS1 also comprises a part forming a hook. The two parts forming hooks are a certain distance away from each other in the initial configuration, and are mutually interlocked in the additional configuration.

More particularly, in FIG. 10, the assembly ENS1 comprises a first pair of first arms BRA1, BRA2 respectively fixed to a first side of the beam PTR in the locations EMP1 and EMP4 located in the vicinity of the two ends of the beam PTR.

The assembly ENS1 also comprises a second pair of second arms BRB1, BRB2 respectively fixed to a second side of the beam PTR, opposite the first side, in two locations EMP2, EMP3 respectively located in the vicinity of the two ends of the part PCPTR of the beam located between the arms of the first pair BRA1, BRA2. The locations EMP1 and EMP2 are spaced apart in the longitudinal direction of the beam, and likewise the locations EMP3 and EMP4.

The assembly ENS1 furthermore comprises, attached near the central part PCPTR of the beam PTR, an additional arm PSPTR equipped, at its end, with a hook CRX1. The body CPS1 has, in this embodiment, in addition to the beam PTL, which is a cantilever beam that is securely fastened to the edge BDC of the housing LG, a hook CRX2 placed at the free end of the beam PTL.

The assembly ENS1 furthermore comprises another additional arm PSPT1 located opposite, relative to the central part PCPTR of the beam, the arm PSPTR. This other additional arm PSPT bears the first electrode E1 of the capacitive device. In this regard, a second body CPS2 is securely fastened to the edge of the housing BDB and also comprises an arm PSPT2 bearing, at its free end, the second electrode E2.

It should be noted that the body CPS2 is also produced in the same metallization level as the assembly ENS1 and the body CPS1. In the initial configuration shown in FIG. 10, the two hooks CRX1 and CRX2 are a certain distance away from each other and the two electrodes E1 and E2 are separated by a distance e0.

In contrast, when the temperature is increased by Joule heating caused by flowing a current through the assembly ENS1, the central part PCPTR of the beam bends (FIG. 11) and the two hooks CRX1 and CRX2 become interlocked. The anti-rollback device DIS is then in its additional configuration in which the beam PTR is immobilized by the hook CRX2. This additional configuration again is naturally irreversible.

Moreover, the bending movement causes the two electrodes E1 and E2 of the capacitive device to move apart. These electrodes are now separated by a distance e1 larger than the distance e0. This changes the capacitance of the capacitive device.

It would also be possible to provide the body CPS1 with additional arms, like those described with reference to FIG. 8, and to provide activation means GENB capable of applying a potential difference to these additional arms to cause the beam PTL to bend, and thus disengage the hook CRX2 from the hook CRX1. The central part PCPTR of the beam then returns to its initial configuration.

Figure 12:
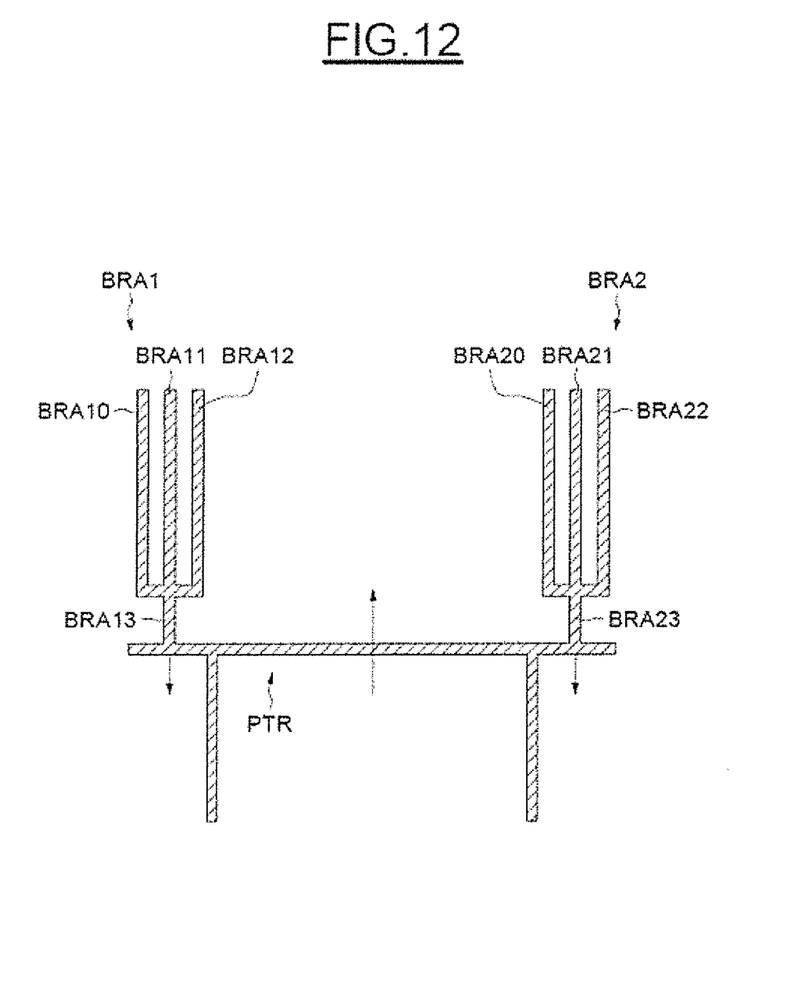
FIG. 12 is a cross-sectional view of the arms with several parallel branches for the mechanical anti-rollback device illustrated in FIG. 10

Each arm BRA1, BRA2 may comprise, as illustrated in FIG. 12, several parallel branches. As shown, three parallel branches BRA10-BRA12 and BRA20-BRA22 are respectively connected to the beam PTR by two end parts BRA13 and BRA23 securely fastened to the beam PTR. Such an embodiment allows for larger thermal deformations.

In the embodiments described above the anti-rollback device DIS had two positions, namely an initial position (initial configuration) and a first position (additional configuration). The device DIS may adopt, as illustrated in FIGS. 13 and 14, several positions.

More precisely, the assembly ENS1 thus steps through a sequence of several additional configurations (such as three additional configurations) respectively corresponding to a sequence of several increasing temperatures. The first body CPS1 and the assembly ENS1 are mutually arranged so that, in the additional configurations, the assembly ENS1 respectively makes contact with different parts of the first body CPS1. A natural rollback from an actual additional configuration to a prior additional configuration is prevented when the temperature drops back below the temperature associated with that of the actual additional configuration.

Figure 13:
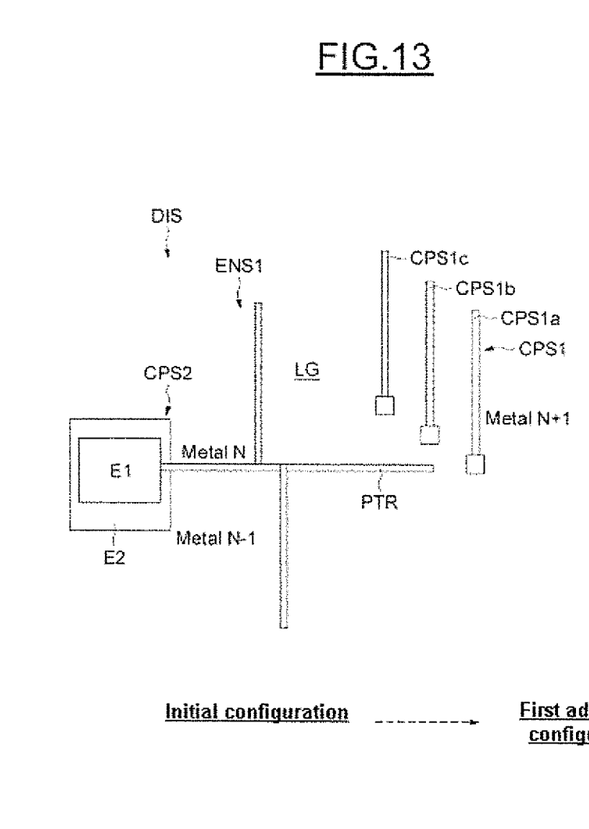
FIG. 13 is a block diagram of the mechanical anti-rollback device in an initial position in accordance with the present invention.
Figure 14:
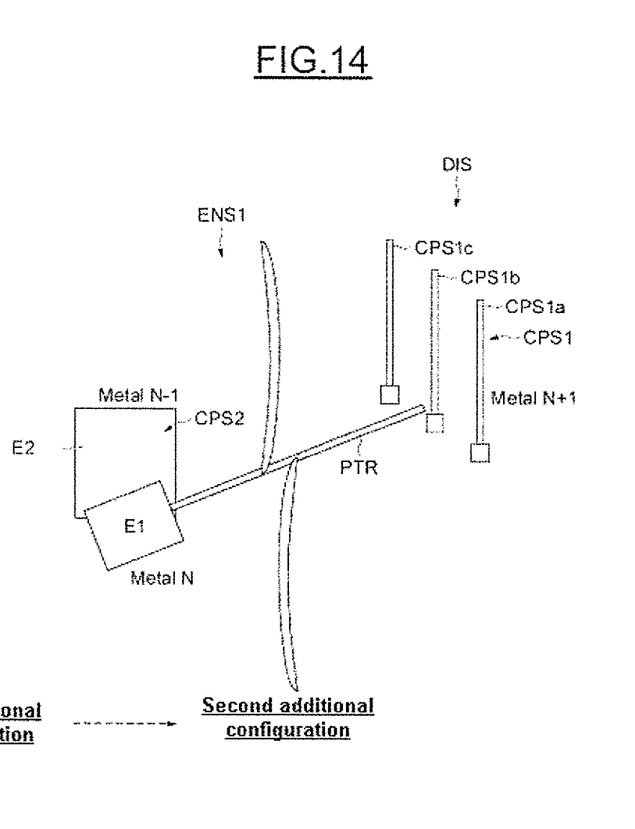
FIG. 14 is a block diagram of the mechanical anti-rollback device in an additional position based on an increase in temperature in accordance with the present invention.

In the embodiment illustrated in FIGS. 13 and 14, the body CPS1 comprises several (such as 3) structurally identical body arms CPS1a, CPS1b and CPS1c that are mutually spaced apart and intended, respectively, to hook the beam PTR in the various additional configurations. In the example illustrated in FIGS. 13 and 14, each body arm has an identical structure to that of the body CPS1 illustrated in FIGS. 7 to 9, for example.

FIG. 13 illustrates the initial configuration in which the beam PTR is a certain distance away from the body CPS1, and therefore, from all the body arms CPS1a-CPS1c.

In its first additional configuration, not shown in FIGS. 13 and 14, the beam PTR will, as explained above, make contact with the first body arm CPS1a when a current is made to flow through the assembly ENS1 by the activation means GEN. Next, as illustrated in FIG. 14, by making a current flow through the assembly ENS1, the beam PTR is brought into contact with the second body arm and is hooked by this second body arm CPS1. The current is larger than the one that enabled the first additional configuration to be adopted. The device DIS is then in its second additional configuration.

The device DIS will then pass into a third additional configuration when a yet larger current is made to flow. In this third additional configuration, the beam PTR will be hooked by the third body arm CPS1c.

Of course, the various additional configurations are naturally irreversible, as indicated above. Since each body arm is equipped with releasing means or circuitry MLB of the type illustrated in FIGS. 8 and 9, it is possible to reset the anti-rollback device DIS, as explained with reference to FIGS. 8 and 9, to return it to its initial configuration (FIG. 13).

As indicated above, the control means or controller MCM controlling the activation means or circuitry GEN preferably uses a symmetric or asymmetric cryptographic algorithm with a secret key. It is also preferable, for security reasons, to use a cryptographic algorithm with a secret key to control the releasing means MLB. This algorithm is advantageously different than those used to control the activation means and/or employ a different key to that used to control the activation means.

Moreover, to further increase the secure nature of the device, it is possible, according to one embodiment, to prevent the beam PTR from becoming unlocked and returning to a prior position or to its initial position even if the device is heated by an external heat source. Specifically, the beam PTR will move in the same direction as the movement that caused it to become locked. The beam PTL, the arms BRS1, BRS2, and the locations where they are fastened to the beam PTL are then produced with dimensions and are arranged, especially taking into account the thermal expansion coefficients of the various elements, so that when the external heat source is removed, the beam PTL reverts to its original position (FIG. 8) before the rollback of the beam PTR.

Figure 15:
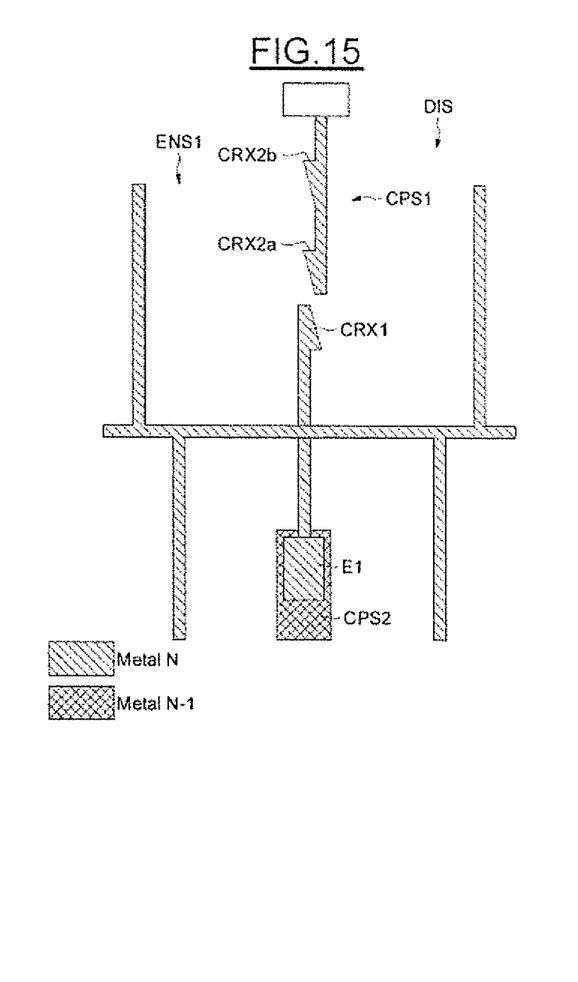
FIG. 15 is a cross-sectional view of another embodiment of the body CPS1 illustrated in FIG. 10 with multiple hooks.
Figure 16:
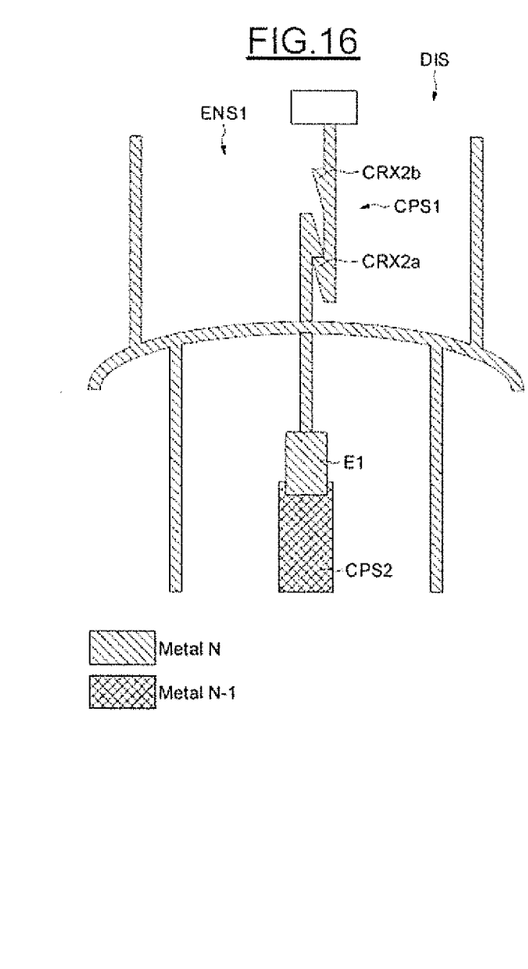
FIG. 16 is a cross-sectional view of the body CPS1 illustrated in FIG. 15 after being exposed to a temperature increase.

In the embodiment illustrated in FIGS. 15 and 16, the first body CPS1 comprises several parts forming hooks CRX2a and CRX2b. These are all located in the same metallization level as the assembly ENS1, and are mutually spaced apart. The hook-forming part CPX1 of the assembly ENS1 is respectively interlocked with the various parts forming hooks of the first body CRX2a CRX2b in the various (such as two) additional configurations.

It should be noted that, in this embodiment, the body CPS2 forming the second electrode E2 of the capacitive device is not located in the same metallization level as the electrode E1 but in a lower metallization level. Thus, in this embodiment, the electrode E1 and the electrode 52 overlap to a greater or lesser extent depending on the configuration. The capacitance of the capacitive device thus takes several different values.

Figure 17:
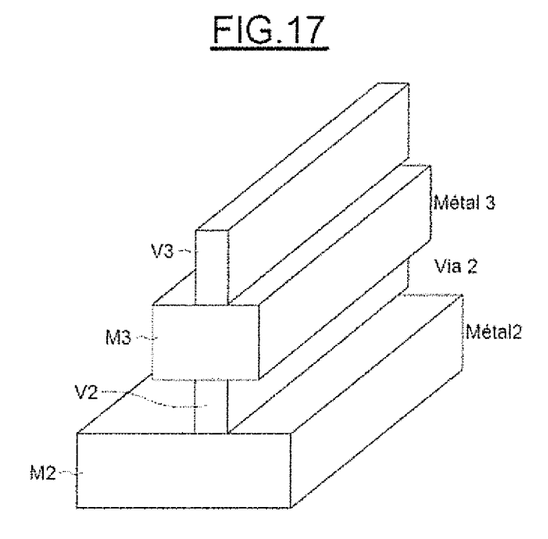
FIGS. 17-19 are views of different components illustrating a method for fabricating an integrated circuit incorporating an anti-rollback device in accordance with the present invention.
Figure 18:
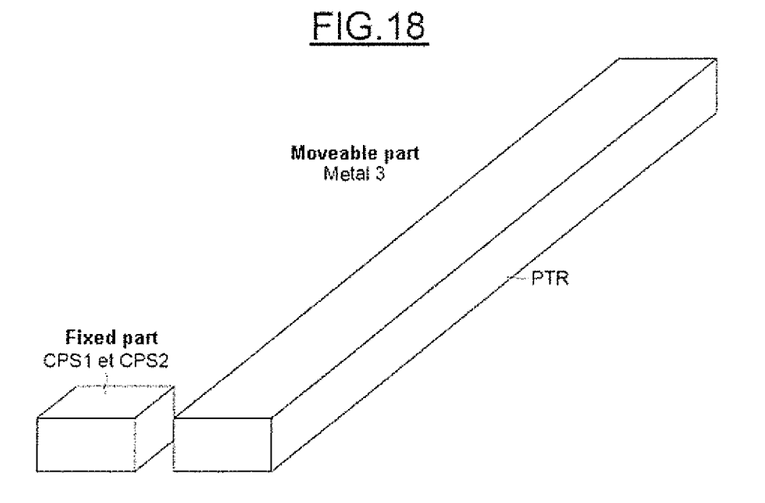
Figure 19:
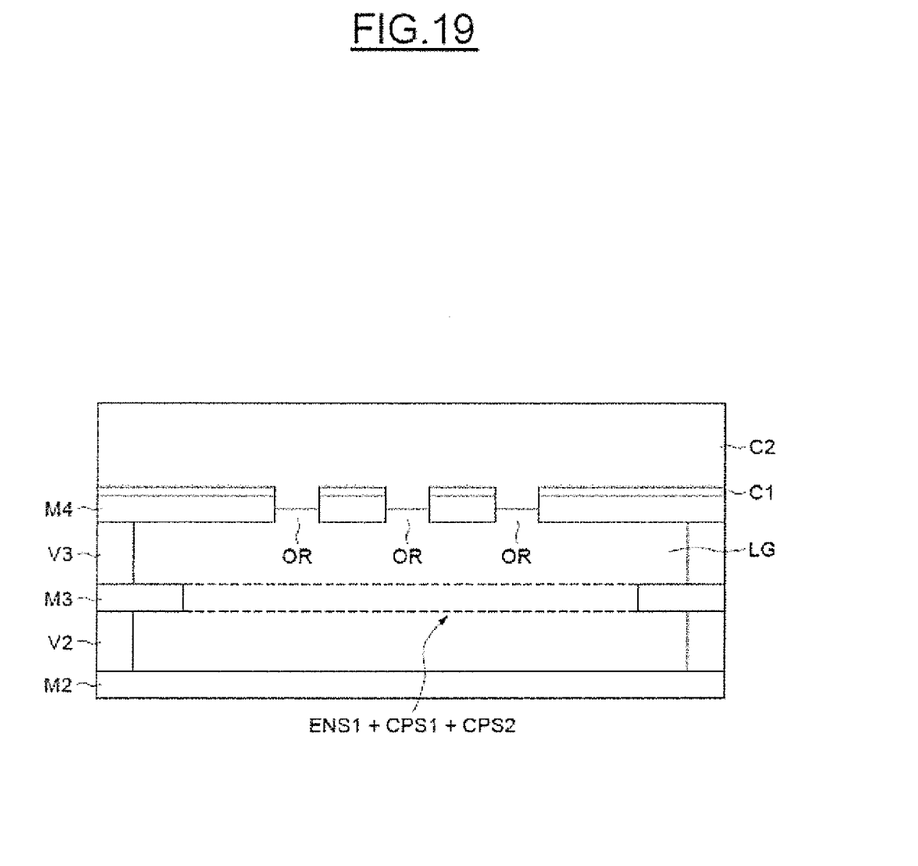

Reference is now made more particularly to FIGS. 17 to 19 to illustrate a method for fabricating an exemplary embodiment of an integrated circuit incorporating an anti-rollback device according to the invention. It is assumed in these figures that the assembly ENS1 and the bodies CPS1 and CPS2 are produced in the same metallization level, for example, in metallization level M3 (Metal 3).

It may be seen (FIG. 17) that the via level V2 of via 2 between metallization level 2 and metallization level 3, and the via level V3 of via 3 between metallization level 3 and metallization level 4, are used to form a protective wall protecting from the subsequent oxide etch that removes the assembly ENS1 and the bodies CPS1 and CPS2.

Moreover, as illustrated in FIG. 18, both the moveable part of the device, in this instance the beam PTR, and the fixed part, in this instance the bodies CPS1 and CPS2, and more particularly, the hook CRX2 illustrated in FIG. 10, are produced in metallization level 3.

The device CMT, and especially the assembly ENS1 and the bodies CPS1 and CPS2, are produced in conventional steps used to fabricate metallization levels and vias. More precisely, as illustrated in FIG. 19, after production of the first metallization level M2 and of the via level V2, the assembly ENS1 and the bodies CPS1 and CPS2, shown by the dashed lines for the sake of simplicity, are produced in a conventional way by etching the subjacent oxide and depositing metal, in this instance copper, in the trenches. Next, the assembly is covered with oxide and the metallization level M4 is then produced.

After a conventional nitride layer C1 has been formed on the metallization level 4, a comb is produced in this metallization level 4 to form orifices OR. Next, isotropic dry etching is carried out followed by wet etching, for example with hydrofluoric acid, to eliminate the insulating (oxide) region encapsulating the assembly ENS1 and the bodies CPS1 and CPS2. This produces the housing LG.

Next, nonconformal oxide deposition is carried out to form a layer C2 blocking the orifices OR. Naturally, what has just been described for metallization levels M2, M3, M4 may be expanded to include metallization level $M_{i-1}, M_i, M_{i+1}$.

The conventional process used to produce the various upper metallization levels then continues. If the assembly ENS1 and/or the body CPS1 and/or the body CPS2 are produced on different metallization levels, the same method is applied while simply increasing the number of via levels and the number of metallization levels.

The anti-rollback device described above may, for example, form an irreversible incremental counter. The various values of the counter correspond to the various capacitances of the capacitive device DCP. The counter may be reset by the releasing means MLB that, as a variation, may also be controlled by coded controller.

That which is claimed:

1. An integrated circuit comprising:
    a substrate;
    a plurality of metallization layers on said substrate, and at least one insulation layer separating said plurality of metallization layers; and
    an electrically activatable mechanical anti-rollback device on said substrate, and comprising
        a housing including at least one wall,
        a first body in said housing, and
        a thermally deformable assembly coupled to the at least one wall of said housing and being in a first metallization layer of said plurality of metallization layers,
        said thermally deformable assembly having an initial configuration and being thermally deformable to at least one additional configuration, with each configuration corresponding to a position of said anti-rollback device,
        said first body and said thermally deformable assembly being mutually arranged so that said thermally deformable assembly is separated from said first body in the initial configuration,
        said thermally deformable assembly comprising a contact part making contact with said first body in the at least one additional configuration to prevent a rollback to the initial configuration when a temperature associated with the at least one additional configuration decreases,
        activation circuitry configured to generate an electrical current flow through said thermally deformable assembly to increase temperature thereof so that said thermally deformable assembly changes from the initial configuration to the at least one additional configuration, and
        detector circuitry configured to detect position of said thermally deformable assembly, and comprising a variable capacitance device comprising a first electrode coupled to said thermally deformable assembly and at least one second electrode in said housing.

2. An integrated circuit according to claim 1, wherein said thermally deformable assembly comprises:
    at least two arms coupled to said housing; and
    a beam held in at least two different locations by said at least two arms, and carrying said contact part making contact with said first body;
    said beam and said at least two arms being located in the first metallization layer.

3. An integrated circuit according to claim 2, wherein said first body comprises:
    at least one body arm coupled to said housing, and comprising a first part located in a second metallization layer of said plurality of metallization layers different from the first metallization layer, and a second part coupled to said first part and extending between the first and second metallization layers;
    said beam being separated from said second part of said at least one body arm in the initial configuration, and being hooked by and making contact with said second part of said at least one body arm in the at least one additional configuration.

4. An integrated circuit according to claim 3, wherein said at least one body arm is configured as a conductive cantilever beam forming said first part and extending substantially perpendicular to said beam, and an electrically conductive appendage adjacent a free end of the cantilever beam and forming said second part, with an end of said electrically conductive appendage extending through the first metallization layer in a direction of said conductive cantilever beam.

5. An integrated circuit according to claim 3, wherein said at least two arms of said thermally deformable assembly are coupled to two fastening points of said beam, with the two fastening points being spaced apart in a longitudinal direction of said beam and on opposite sides of said beam; and with the portion of said beam being hooked in the at least one additional configuration being located between a free end of said beam and one of the two fastening points.

6. An integrated circuit according to claim 5, wherein said at least two arms of said thermally deformable assembly comprises a first pair of arms and a second pair of arms;

with said first pair of first arms respectively coupled to a first side of said beam adjacent opposite ends thereof;

with said second pair of second arms respectively coupled to a second side of said beam opposite the first side, and between said first pair of first arms, and points where a first arm and a second neighboring arm are respectively coupled to said beam are spaced apart in the longitudinal direction of the beam; and with the portion of said beam being hooked extending from a central portion of said beam.

7. An integrated circuit according to claim 6, wherein each first arm in said first pair of first arms comprises a plurality of branches, and a trunk coupled to said plurality of branches at an adjacent opposite end of said beam.

8. An integrated circuit according to claim 3, wherein the at least one additional configuration comprises a plurality of additional configurations arranged in a sequence; and said thermally deformable assembly being configured to step through the sequence of additional configurations corresponding to a sequence of increasing temperatures, and for each additional configuration, making contact with a different part of said first body to prevent a rollback to a previous configuration when the temperature decreases;

said activation circuitry being configured to generate electrical current flows through said thermally deformable assembly to increase temperatures thereof so that said thermally deformable assembly changes from the initial configuration to the plurality of additional configurations.

9. An integrated circuit according to claim 8, wherein said at least one body arm comprises a plurality of identical body arms that are mutually spaced apart and respectively hook said beam in the plurality of additional configurations.

10. An integrated circuit according to claim 8, wherein said thermally deformable assembly comprises an assembly hook, and said first body comprising a plurality of body hooks located in the first metallization layer and mutually spaced apart, with each body hook being mutually interlocked with said assembly hook corresponding to the additional configurations.

11. An integrated circuit according to claim 1, wherein said thermally deformable assembly comprises an assembly hook, and said first body comprises a body hook located in the first metallization layer, and with said assembly hook and said body hook being mutually separated in the initial configuration and mutually interlocked in the at least one additional configuration.

12. An integrated circuit according to claim 1, wherein said variable capacitive device comprises, in said housing, a second fixed electrically conductive body forming said second electrode, with the different configurations respectively corresponding to different distances separating said second electrode from said first electrode; and wherein said detector circuitry comprises a reader to read the capacitance of said variable capacitive device.

13. An integrated circuit according to claim 12, wherein said second electrode is located in a metallization layer different from the first metallization layer.

14. An integrated circuit according to claim 12, wherein said first electrode is located opposite where said assembly makes contact with said first body in the at least one additional configuration.

15. An integrated circuit according to claim 12, wherein said reader comprises an electrical circuit connected to said first and second electrodes.

16. An integrated circuit according to claim 1, further comprising a coded control circuit configured to control said activation circuitry.

17. An integrated circuit according to claim 1, furthermore comprising a release circuit configured to release said contact part making contact with said first body in the at least one additional configuration so that said thermally deformable assembly can return to the initial configuration.

18. An integrated circuit comprising:
a substrate; and
an anti-rollback device on said substrate, and comprising
a housing including at least one wall,
a first body in said housing, and
a thermally deformable assembly coupled to the at least one wall of said housing,
said thermally deformable assembly having an initial configuration and being thermally deformable to at least one additional configuration, with each configuration corresponding to a position of said anti-rollback device,
said first body and said thermally deformable assembly being mutually arranged so that said thermally deformable assembly is separated from said first body in the initial configuration,
said thermally deformable assembly comprising a contact part making contact with said first body in the at least one additional configuration to prevent a rollback to the initial configuration when a temperature associated with the at least one additional configuration decreases, and
activation circuitry configured to generate an electrical current flow through said thermally deformable assembly to increase temperature thereof so that said thermally deformable assembly changes from the initial configuration to the at least one additional configuration.

19. An integrated circuit according to claim 18, wherein said anti-rollback device further comprises detector circuitry configured to detect position of said thermally deformable assembly, and comprising a variable capacitance device comprising a first electrode coupled to said thermally deformable assembly and at least one second electrode in said housing.

20. An integrated circuit according to claim 18, wherein said thermally deformable assembly comprises:
at least two arms coupled to said housing; and
a beam held in at least two different locations by said at least two arms, and carrying said contact part making contact with said first body.

21. An integrated circuit according to Claim 20, wherein said first body comprises:
at least one body arm coupled to said housing, and comprising a first part, and a second part coupled to said first part;
said beam being separated from said second part of said at least one body arm in the initial configuration, and being hooked by and making contact with said second part of said at least one body arm in the at least one additional configuration.

22. An integrated circuit according to claim 21, further comprising:
plurality of metallization layers on said substrate, and at least one insulation layer separating said plurality of metallization layers; and
wherein said thermally deformable assembly is in a first metallization layer of said plurality of metallization layers;

wherein said first part of said at least one body arm is located in a second metallization layer of said plurality of metallization layers different from the first metallization layer, and said second part of said at least one body arm extends between the first and second metallization layers.

23. An integrated circuit according to claim 18, wherein said variable capacitive device comprises, in said housing, a second fixed electrically conductive body forming said second electrode, with the different configurations respectively corresponding to different distances separating said second electrode from said first electrode; and wherein said detector circuitry comprises an electrical circuit connected to said first and second electrodes to read the capacitance of said variable capacitive device.

24. An integrated circuit according to claim 18, further comprising a release circuit configured to release said contact part making contact with said first body in the at least one additional configuration so that said thermally deformable assembly can return to the initial configuration.

25. A method for making an integrated circuit comprising:
  forming an anti-rollback device on a substrate, and comprising
    forming a housing including at least one wall,
    forming a first body in the housing, and
    forming a thermally deformable assembly coupled to the at least one wall of the housing,
    the thermally deformable assembly having an initial configuration and being thermally deformable to at least one additional configuration, with each configuration corresponding to a position of the anti-rollback device,
    the first body and the thermally deformable assembly being mutually arranged so that the thermally deformable assembly is separated from the first body in the initial configuration,
    the thermally deformable assembly comprising a contact part making contact with the first body in the at least one additional configuration to prevent a rollback to the initial configuration when a temperature associated with the at least one additional configuration decreases, and
  forming activation circuitry to generate an electrical current flow through the thermally deformable assembly to increase temperature thereof so that the thermally deformable assembly changes from the initial configuration to the at least one additional configuration, 26. A method according to claim 25, wherein forming the anti-rollback device further comprises forming detector circuitry to detect position of the thermally deformable assembly, with the detector circuitry comprising a variable capacitance device comprising a first electrode coupled to the thermally deformable assembly and at least one second electrode in the housing.

27. A method according to claim 25, wherein forming the thermally deformable assembly comprises:
  forming at least two arms coupled to the housing; and
  forming a beam held in at least two different locations by the at least two arms, and carrying the contact part making contact with the first body.

28. A method according to claim 27, wherein forming the first body comprises:
  forming at least one body arm coupled to the housing, and comprising a first part, and a second part coupled to the first part;
  the beam being separated from the second part of the at least one body arm in the initial configuration, and being hooked by and making contact with the second part of the at least one body arm in the at least one additional configuration.

29. A method according to claim 28, further comprising:
  plurality of metallization layers on the substrate, and at least one insulation layer separating the plurality of metallization layers; and
  wherein the thermally deformable assembly is in a first metallization layer of the plurality of metallization layers;
  wherein the first part of the at least one body arm is located in a second metallization layer of the plurality of metallization layers different from the first metallization layer, and the second part of the at least one body arm extends between the first and second metallization layers.

30. A method according to claim 25, wherein the forming variable capacitive device comprises, in the housing, forming a second fixed electrically conductive body forming the second electrode, with the different configurations respectively corresponding to different distances separating the second electrode from the first electrode; and wherein forming the detector circuitry comprises forming an electrical circuit connected to the first and second electrodes to read the capacitance of the variable capacitive device.

31. A method according to claim 25, further comprising forming a release circuit to release the contact part making contact with the first body in the at least one additional configuration so that the thermally deformable assembly can return to the initial configuration.

* * * * *